United States Patent
Boden, Jr.

(10) Patent No.: US 6,747,312 B2
(45) Date of Patent: Jun. 8, 2004

(54) RAD HARD MOSFET WITH GRADED BODY DIODE JUNCTION AND REDUCED ON RESISTANCE

(75) Inventor: Milton J. Boden, Jr., Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 9 days.

(21) Appl. No.: 10/138,164

(22) Filed: May 1, 2002

(65) Prior Publication Data

US 2003/0205829 A1 Nov. 6, 2003

(51) Int. Cl.$^7$ ............................................. H01L 29/76
(52) U.S. Cl. .................. 257/327; 257/328; 257/335; 257/341
(58) Field of Search ............................... 257/327, 328, 257/335, 341

(56) References Cited

U.S. PATENT DOCUMENTS

| | | | |
|---|---|---|---|
| 4,593,302 A | * 6/1986 | Lidow et al. ............... 257/342 |
| 5,322,804 A | * 6/1994 | Beasom ..................... 438/227 |
| 5,338,693 A | * 8/1994 | Kinzer et al. .............. 438/268 |
| 5,475,252 A | * 12/1995 | Merrill et al. .............. 257/341 |
| 5,541,435 A | * 7/1996 | Beasom ..................... 257/409 |
| 5,770,880 A | * 6/1998 | Woodbury et al. ......... 257/336 |
| 5,831,318 A | * 11/1998 | Spring et al. .............. 257/402 |
| 2003/0197220 A1 | * 10/2003 | Disney ...................... 257/328 |

* cited by examiner

Primary Examiner—T. N. Quach
(74) Attorney, Agent, or Firm—Ostrolenk, Faber, Gerb & Soffen, LLP

(57) ABSTRACT

A Rad Hard MOSFET has a plurality of closely spaced base strips which have respective source to form invertible surface channels with the opposite sides of each of the stripes. A non-DMOS late gate oxide and overlying conductive polysilicon gate are formed after the source and base regions have been diffused. The base strips are spaced by about 0.6 microns, and the polysilicon gate stripes are about 3.2 microns wide. An enhancement region is implanted through spaced narrow window early in the process and are located in the JFET common conduction region which is later formed by and between the spaced base stripes. The device is a high voltage (greater than 25 volts) device with very low gate capacitance and very low on resistance. An early and deep (1.6 micron) P channel implant and diffusion are formed before the main channel is formed to produce a graded body diode junction.

22 Claims, 3 Drawing Sheets

US 6,747,312 B2

RAD HARD MOSFET WITH GRADED BODY DIODE JUNCTION AND REDUCED ON RESISTANCE

RELATED APPLICATION

This application is related to application Ser. No. 10/205,125, filed Jul. 23, 2002 entitled P CHANNEL RAD HARD MOSFET WITH ENHANCEMENT IMPLANT (IR-1690); the disclosure of which is incorporated herein by reference.

FIELD OF THE INVENTION

This invention relates to MOSFET devices and more specifically relates to a MOSFET for operation in a high radiation environment and the process for its manufacture.

BACKGROUND OF THE INVENTION

Power MOSFETs are well known and processes for the manufacture of MOSFETs which are operable in high radiation [megarad ionizing radiation] environments are also known. Thus, it is known that a "late gate" which is a non-self aligned gate relative to an invertible channel region, should be used in the manufacture of such devices, known as Rad Hard (radiation hardened) devices. By using a late gate process, the gate oxide is not subjected to the high diffusion temperatures used for the diffusion of base and source regions. The exposure of the gate oxide to such high temperatures reduces the ability of the device to operate in a high radiation environment such as that experienced at very high altitudes or by orbiting space vehicles. Such processes are described in U.S. Pat. No. 5,338,693 in the name of Kyle Spring et al.; U.S. Pat. No. 5,475,252 in the name of Kyle Spring et al.; U.S. Pat. No. 5,831,318 in the name of Perry Merrill; and U.S. Ser. No. 09/263,916 in the name of Milton Boden et al. describe this problem and propose respective solutions.

The topology employed for Rad Hard devices may be cellular, but in some cases, such as for low voltage MOSFETs with a low gate capacitance it is also known that a stripe geometry is preferred, as described in U.S. Ser. No. 09/263,916.

Many MOSFET applications have the required condition of high voltage (in excess of about 25 volts), and low $R_{DSON}$. It is known that the $R_{DSON}$ of a cellular MOSFET can be reduced by an increasing (often termed enhancing) the conductivity in the JFET region between spaced bases. This reduces the efficiency of the inherent JFET region and reduces the pinch-off of the region by reducing the expansion of the depletion regions from the spaced bases forming the JFET. This type of enhanced conductivity region and the process for its formation are described in U.S. Pat. Nos. 4,376,286; 4,593,302 and 4,680,853, in the names of Lidow and Herman. These patents do not disclose or suggest how such an enhancement can be applied to a Rad Hard type device.

All vertical conduction MOSFET devices have an inherent or parasitic body diode. This diode is formed by the junction between the channel diffusion, which is P type for an N channel device and the N$^-$ junction receiving layer. This structure is an abrupt junction and turns off relatively quickly, creating high voltage surges in an inductive circuit. Further, a relatively high avalanche current will flow in the series circuit including the relatively high conductivity P channel region (in an N channel device). It would be desirable to modify the characteristics of the body diode to offset these characteristics.

BRIEF SUMMARY OF THE INVENTION

The present invention is for a novel structure and process for its manufacture of a high voltage N or P channel Rad Hard MOSFET which has a reduced $Q_g$ and $R_{DSON}$. To obtain these conflicting requirements, a linear stripe geometry is used with a fine polysilicon gate line width of about 3.2$\mu$ and a very close spacing of about 2.2$\mu$. The use of this close spacing permits the increase of the number of stripes (or cells) per unit area and thus increases the total channel width. The JFET pinch is then reduced by a novel masked enhancement implant through a very narrow window about 0.6$\mu$ (in contrast to the blanket implant of U.S. Pat. No. 4,593,302). This heavily doped enhancement region creates a heavily doped cylindrically shaped region in the parasitic JFET. Thus, $R_{DSON}$ is further considerably reduced.

A further important feature of the invention is the novel modification of the body diode structure by grading its concentration; that is, by reducing concentration drastically with depth of the channel diffusion. In a preferred embodiment, this is accomplished by adding a low concentration, but very deep body diffusion at the beginning of the manufacturing process, followed by the conventional formation of a shallower, higher concentration channel diffusion. The result is a highly graded body diode which will have softer turn off characteristics. Further, the lower concentration portion of the diode will be in series with avalanche current and will therefore limit avalanche current magnitude to better protect the device in avalanche. The graded junction also provides a reduction in the source-drain capacitance at low drain source bias.

DETAILED DESCRIPTION OF THE DRAWINGS

Figure 1:
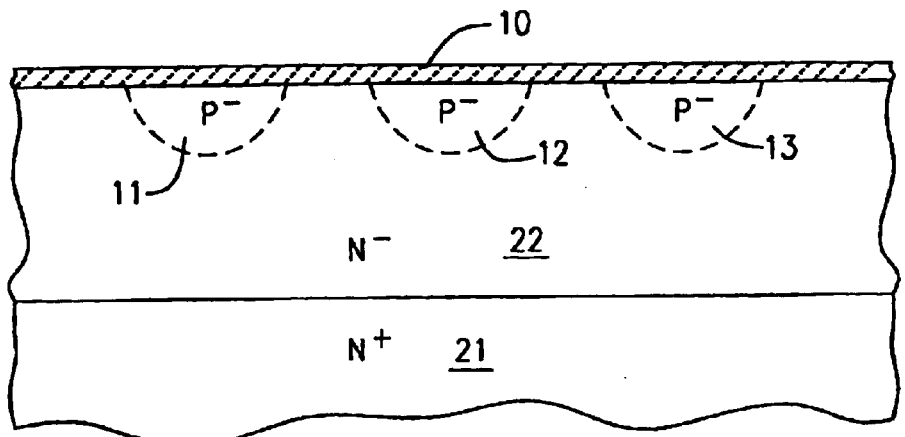
FIG. 1 is a cross-section of a small portion of the active area of a Rad Hard device wafer after the formation of a deep low concentration diffusion to become part of the device body diode.
Figure 2:
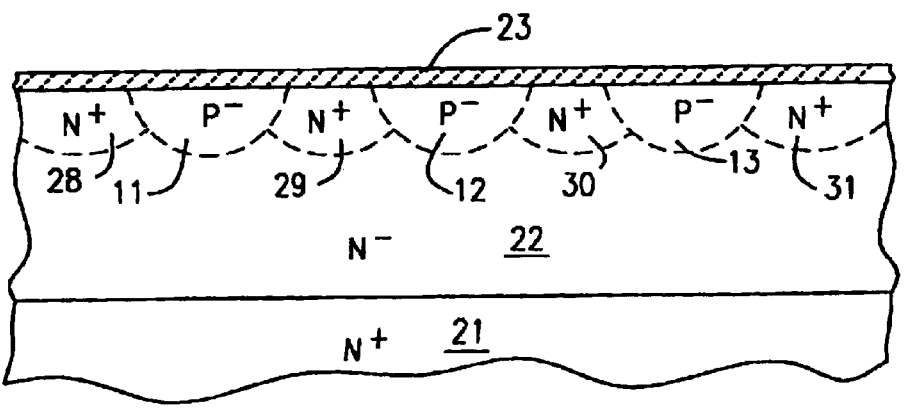
FIG. 2 is a cross-section of a small portion of the active area of a Rad Hard device wafer after the formation of an enhancement implant.

Referring first to FIG. 1, there is shown a very small portion of a monocrystaline silicon wafer 20 comprising a N$^+$ substrate 21 and an epitaxially deposited N$^-$ layer 22 on its top, sometimes termed an epi layer. The concentration and thickness of N$^-$ layer 22, which is the junction receiving layer, depend on the desired break down voltage of the final device, which may, for example, be 100 volts. The wafer is then processed to form a plurality of laterally spaced identical devices which are separated from one another, as by sawing.

The Figures to be described show the invention as applied to an N channel Rad Hard MOSFET. It should be noted that the invention herein can apply to MOSgated devices in general, including MOSFETs and IGBTs. Further, the invention can be used in connection with P channel devices by reversing all conductivity types. Further the term wafer used herein is interchangeable with the terms die or chip which refer to the individual devices which are singulated from a large area wafer. Finally, the device may be applied to devices of voltage ratings greater than about 50 volts.

FIG. 1 shows the initial formation of a thermal implant screening oxide layer 10 which is about 500 Å thick and provides a cap for the subsequent implant and diffusion of P⁻ regions 11, 12 and 13. More specifically, after suitable cleaning steps, a photoresist is formed atop oxide 10 and the photoresist is processed in a photolithographic mask step to form narrow implant windows, about 0.6 microns wide with a center to center spacing of about 6.4 microns. A P⁻ boron implant is then carried out at 120 KeV and a dose of about 1E13. The photoresist is then stripped by a suitable etch and the wafer surface is cleaned and the implants are then diffused at a temperature of 1175° C. for 480 minutes to a depth of about 2.5 microns and a lateral width nearly equal to the depth.

An enhancement photoresist mask is then applied atop an oxide layer 23 and is photo-lithographically processed to form parallel spaced elongated stripe windows which are about 0.6 microns wide and are spaced, center-to-center, by about 6.4 microns. A phosphorus enhancement implant at about 80 KeV and a dose of about 2E13 to 3E13 is then applied to the top surface, forming spaced phosphorus implants.

Figure 3:
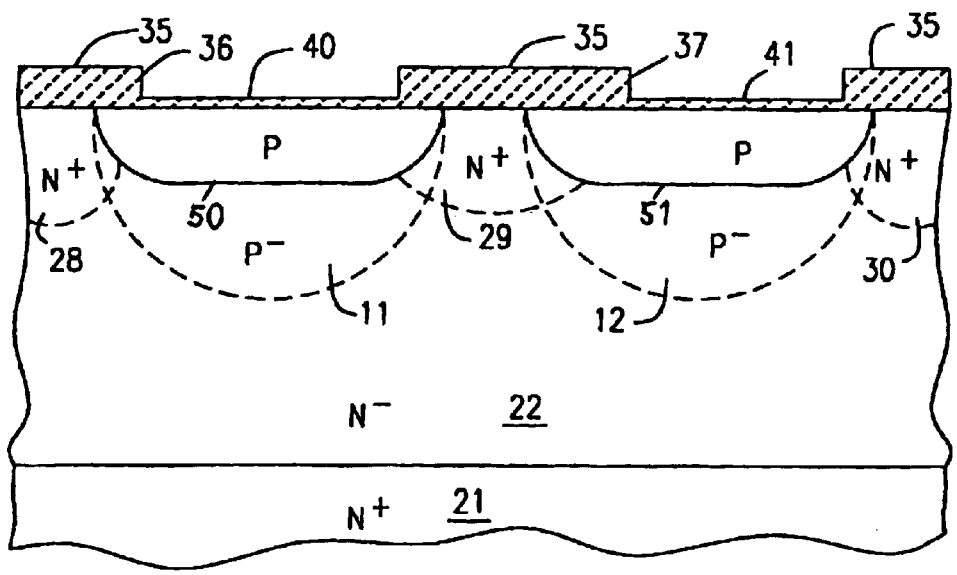
FIG. 3 is a cross-section of the wafer of FIG. 2 after the formation of spaced channel diffusion stripes and the drive of the enhancement implant and the further drive of the P$^-$ body diode region.

The photo resist is then stripped and, as shown in FIG. 3, the phosphorus implants are diffused in an enhancement drive at about 1175° C. for 60 minutes to form phosphorus diffusions 28, 29, 30, 31 a depth of about 8000 Å. The P⁻ (boron) implants 11, 12 and 13 are also driven at this time toward their final depth of about 3.5 microns. During this drive, SiO₂ oxide layer 35 is grown on the exposed silicon surface to about 6000 Å. A photoresist is then applied to the top surface and is exposed by a second photomask step (a channel mask) and the oxide 35 is plasma etched to form elongated parallel stripe windows 36 and 37. The photoresist is then stripped and a screening oxide 40, 41, 42 is grown to a thickness of about 500 Å. A boron channel implant at about 50 KeV and dose of about 2E14 is then applied to the top surface. The surface is then cleaned and a high temperature diffusion at about 1125° C. for 50 minutes is then applied to drive the boron implants to a depth of about 1.7 microns to form N type channel diffusions 50, 51 and 52, which overlap the enhancement implants 30, 31, as shown. Note that P⁻ (boron) channel diffusion regions 11, 12 also deepen during this drive.

Following the channel drive, an undoped layer of polysilicon is grown to about 5000 Å atop the wafer, and is etched to leave polysilicon spacers 60, 62, 63 and 64 (FIG. 4) in place. After the spacer etch, the wafer is subjected to an HF etch (100:1HF) for about 20 seconds. A shallow P⁺ implant (boron at 100 KeV and a dose of 3E15) is then applied to the top surface of the wafer, forming shallow P⁺ implants 66 and 67 which are self aligned to the channel mask, but is pulled back by the poly spacers so they do not contribute to the doping at the channel/oxide interface. Implants 66 and 67 are contact regions for a subsequently formed source contact.

Figure 4:
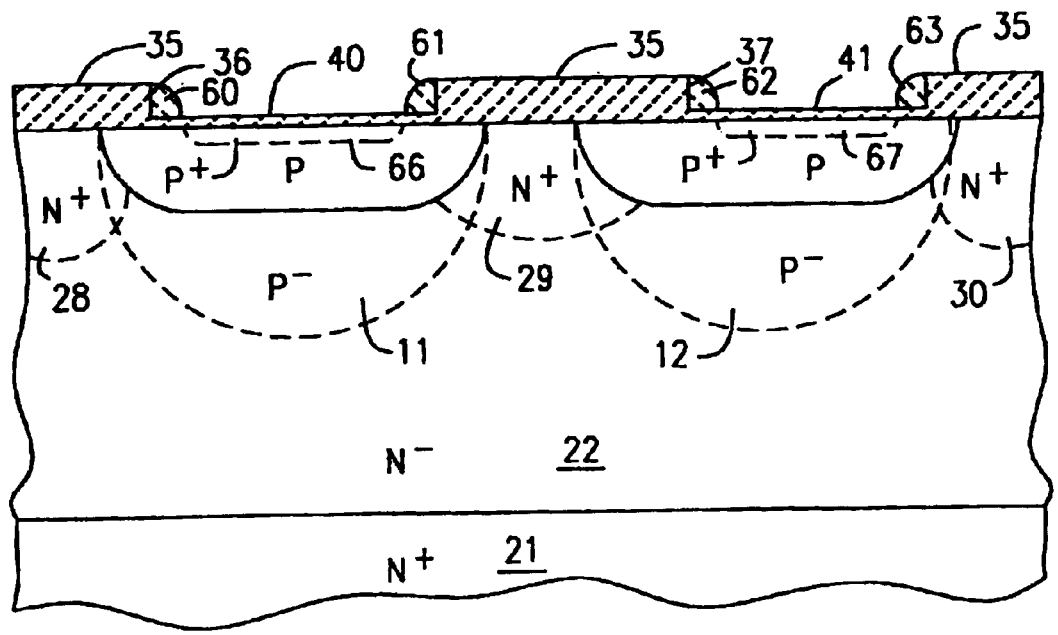
FIG. 4 is a cross-section of the wafer of FIG. 3 after the formation of polysilicon spacers and a shallow P$^+$ contact implant.

The spacers 60 to 63 are then appropriately removed as shown in FIG. 4 and the top (or front side) of the wafer is protected by a photoresist coat to enable a back side polysilicon etch to remove polysilicon from the back side of the wafer (not shown). A P⁺ diffusion drive is then used at 975° C. for about 120 minutes to drive regions 66 and 67.

Figure 5:
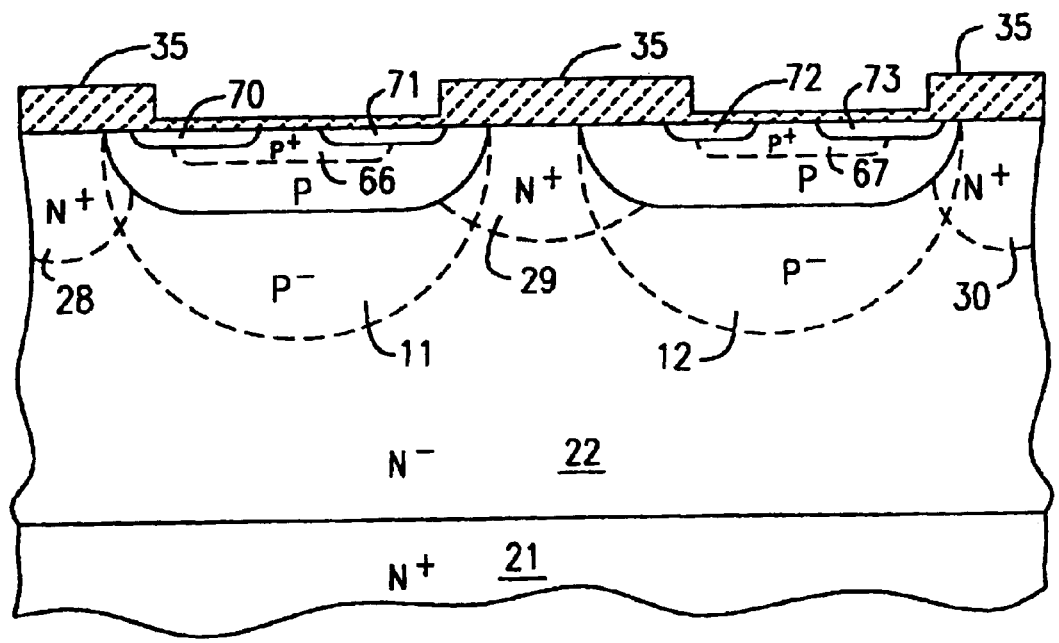
FIG. 5 is a cross-section of the wafer of FIG. 4 after the removal of the polysilicon spacers and the formation of N type source regions.

Therefore, a photoresist is applied to the top surface and a source mask step is photolithographically carried out. Arsenic N⁺ source regions 70, 71, 72 and 73 (FIG. 5) are then implanted through the source windows at 120 KeV and a dose of about 3E15 the photoresist is stripped and, following a prediffusion clean, the N⁺ sources 70 to 73 are suitably driven at high temperature for example 975° C. for 150 minutes to activate the source implants.

A BOE oxide etch is then carried out to remove all oxides an a sacrificial gate oxide is grown. A TEOS field oxide is also grown on the wafer. An active mask step is then carried out, leaving field oxide only in the termination area and under the gate pads and gate runners (not shown). The photoresist is then stripped.

A thin (150 Å) oxide may next be grown and a threshold adjust implant (arsenic at 120 KeV, and dose of 1.4E12) is done. This step allows the use of a high channel implant dose to reduce the parasitic bipolar gain. This is useful to prevent single event (SEE) burnout.

Figure 6:
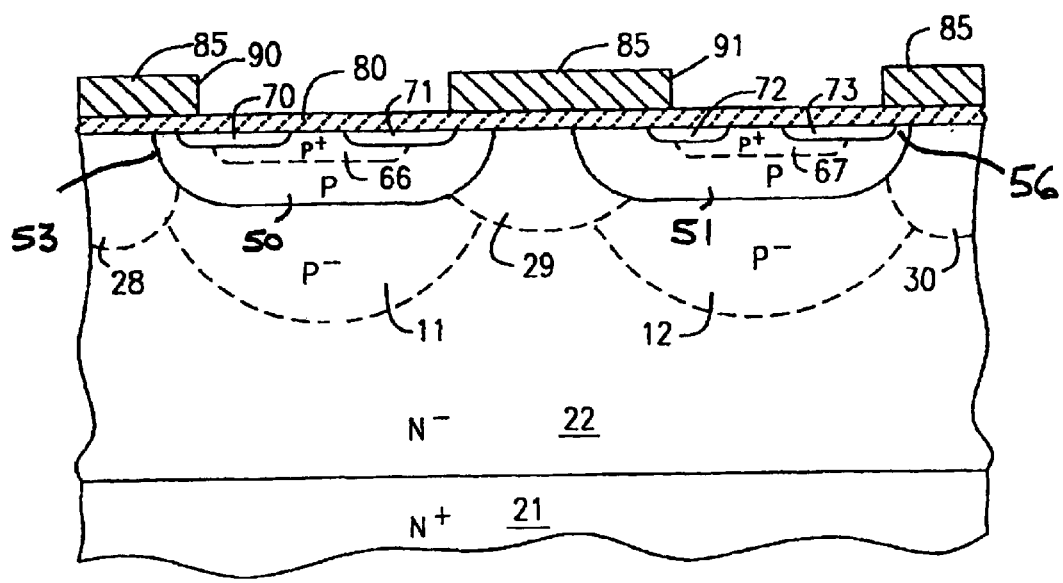
FIG. 6 is a cross-section of the wafer of FIG. 5 after the formation of a non self aligned gate oxide and a conductive polysilicon gate electrode.

As shown in FIG. 6, the gate oxide 80 is finally grown (after most high temperature diffusion steps). The gate oxide thickness is about 900 Å.

An undoped polysilicon layer 85 is next grown atop gate oxide 80 as shown in FIG. 6. The polysilicon layer is then made conductive by a phosphorus implant at 80 KeV and a dose of 1E16. The phosphorus is then driven at 850° C. for 60 minutes.

Thereafter, a photoresist mask is formed on the top surface and a polysilicon mask and etch is carried out, forming windows 90 and 91 in FIG. 6 with the polysilicon gate electrodes overlying the invertible P channel regions 53 and 56 formed between the source regions 70 to 73 and the exteriors of channel diffusion regions 50, 51. Note that the gate structure is not self aligned with the source and channel regions as is the case when the gate is formed before the source and channel are formed by the well known DMOS process. The resist is then stripped, forming the structure of FIG. 6. The polysilicon line width is preferably about 3.2 microns and the channel regions 50, 51 are preferably spaced by about 0.8 microns.

Figure 7:
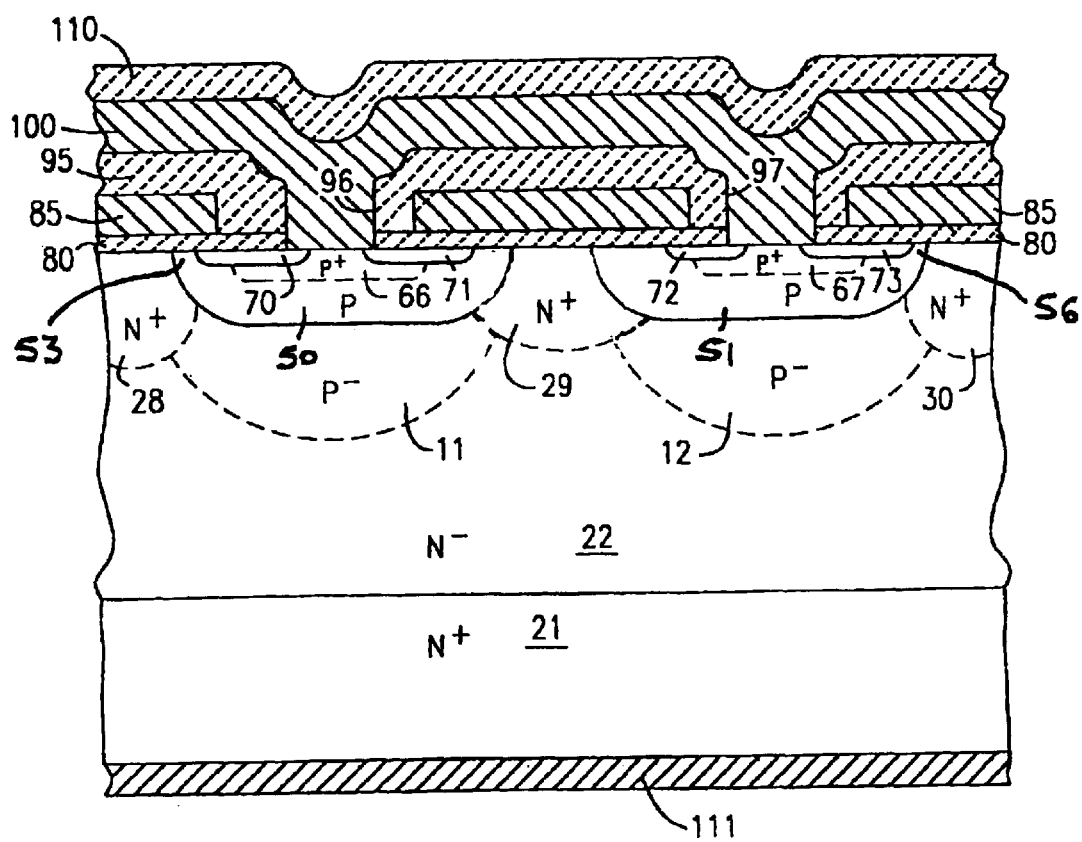
FIG. 7 shows the wafer of FIG. 6 after the formation of an insulation interlayer to insulate the polysilicon gate and the formation of the source electrode and drain electrodes, and a top insulation low temperature oxide (LTO) layer.

Thereafter a TEOs oxide layer 95 is grown atop the wafer encapsulating the polysilicon gate strips 85. A photoresist is applied to the top surface, and a contact mask step is photolithographically carried out. A plasma etch is then used to define contact windows 96 and 97 (FIG. 7) and leaving the polysilicon gate strips encapsulated between TEOS layer 95 and the edges of gate oxide 80.

The wafer is then cleaned to prepare the surfaces for a metal sputter operation. An aluminum source electrode 100 is then sputtered atop the wafer surface to a thickness of about 8 microns. Thereafter, a conventional metal mask step is carried out to define source and gate regions (not shown) and the photoresist is stripped and the metal surface is defreckled. An LTO oxide layer 110 is then deposited atop the aluminum layer 100 and a pad mask etch step is carried out to remove the LTO from the pad connection regions.

Finally, the resist is stripped, the front surface is taped, and the back surface is ground and a suitable Ti/Ni/Ag back drain metal 111 is applied to the wafer back surface.

The resulting device has the desired properties of a Rad Hard MOSFET with very low gate capacitance and very low on resistance and a graded body diode junction.

Although the present invention has been described in relation to particular embodiments thereof, many other variations and modifications and other uses will become apparent to those skilled in the art. It is preferred, therefore, that the present invention be limited not by the specific disclosure herein

What is claimed is:

1. A radiation-hardened MOSFET comprising:
    a silicon wafer having a flat junction receiving region of a first conductivity type;
    a plurality of channel diffusions having an opposite conductivity type from said first conductivity type positioned such that a space is defined between adjacent channel diffusions, each of the channel diffusions having a given concentration and a given depth;
    a plurality of source diffusions of said first conductivity type disposed in each of said channel diffusions, each of the source diffusions having boundary regions defining a plurality of respective invertible channel regions between boundary regions of said channel diffusions and said boundary regions of said source diffusions;
    a conductive gate polysilicon segment overlying at least a portion of a non-self-aligned gate oxide overlying each of said respective invertible channel regions and a portion of said respective source diffusions;
    enhancement diffusions of said first conductivity type disposed in the space between adjacent pairs of said invertible channel regions, said enhancement diffusions having a higher concentration than that of said flat junction receiving region; and
    a plurality of second diffusions of said opposite conductivity type having a depth greater than said given depth and each of the plurality of second diffusions being disposed beneath and continuous with respective ones of said channel diffusions and having a lower concentration less than said given concentration, such that graded body diode regions are defined.

2. The radiation-hardened MOSFET of claim 1, wherein said space between adjacent pairs of said channel diffusions is about 0.8 microns.

3. The radiation-hardened MOSFET of claim 2, wherein said conductive gate polysilicon have a poly line width of about 3.2 microns.

4. The radiation-hardened MOSFET of claim 3, wherein the depth of said enhancement diffusions is at least as deep as the depth of said channel diffusions.

5. The radiation-hardened MOSFET of claim 4, wherein the depth of said enhancement diffusions is at least 1.7 microns.

6. The radiation-hardened MOSFET of claims 3, further comprising a conductive source electrode formed atop said flat junction receiving region and in contact with each of said source diffusions and said channel diffusions.

7. The radiation-hardened MOSFET of claim 6, wherein said silicon wafer has a bottom surface and said bottom surface, opposite of said flat junction receiving region, has a drain electrode formed thereon, such that said MOSFET is a vertical conduction MOSFET.

8. The radiation-hardened MOSFET of claim 2, wherein said enhancement diffusions have a depth which is about as deep as said channel diffusions.

9. The radiation-hardened MOSFET of claim 8, wherein the depth of said enhancement diffusions is at least 1.7 microns.

10. The radiation-hardened MOSFET of claim 2, further comprising a conductive source electrode formed atop said first junction receiving region and in contact with each of said source diffusions and said channel diffusions.

11. The radiation-hardened MOSFET of claim 10, wherein said silicon wafer has a bottom surface and said bottom surface, opposite of said flat junction receiving region, has a drain electrode formed thereon, such that said MOSFET is a vertical conduction MOSFET.

12. The radiation-hardened MOSFET of claim 1, wherein said conductive gate polysilicon segments have a poly line width of about 3.2 microns.

13. The radiation-hardened MOSFET of claim 1, wherein said enhancement diffusions have a depth which is about as deep as said channel diffusions.

14. The radiation-hardened MOSFET of claim 13, wherein the depth of said enhancement diffusions is at least 1.7 microns.

15. The radiation-hardened MOSFET of claim 1, further comprising a conductive source electrode formed atop said flat junction receiving region and in contact with each of said source diffusions and said channel diffusions.

16. The radiation-hardened MOSFET of claim 15, wherein said silicon wafer has a bottom surface and said bottom surface, opposite of said flat junction receiving region, has a drain electrode formed thereon, such that said MOSFET is a vertical conduction MOSFET.

17. A radiation-hardened MOSFET comprising:
    a silicon wafer having a flat junction receiving region of a first conductivity type;
    a plurality of channel diffusions having an opposite conductivity type opposite of said first conductivity type and having a given concentration and a given depth positioned such that a space is defined between adjacent channel diffusions;
    a plurality of source diffusion regions of said first conductivity type in each of said channel diffusions, each of the source diffusion regions having boundary regions defining a plurality of respective invertible channel regions between boundary regions of said channel diffusions and said boundary regions of said source diffusions;
    a conductive gate polysilicon segment overlying at least a portion of a non-self-aligned gate oxide overlying each of said respective invertible channel regions and a portion of said source diffusions; and
    a plurality of second diffusions of said opposite conductivity type having a depth greater than said given depth and each of the plurality of second diffusions being disposed beneath respective ones of said channel diffusions and having a concentration less than said given concentration such that graded body diode regions are defined.

18. The radiation-hardened MOSFET of claim 17, wherein said space between said adjacent channel diffusions is about 0.8 microns.

19. The radiation-hardened MOSFET of claim 17, wherein said conductive gate polysilicon segments have a poly line width of about 3.2 microns.

20. The radiation-hardened MOSFET of claim 17, further comprising a source electrode formed atop said junction receiving region and in contact with a portion of respective ones of said source diffusions and said channel diffusion.

21. The radiation-hardened MOSFET of claim 20, wherein said silicon wafer has a bottom surface and said bottom surface, opposite of said flat junction receiving region, has a drain electrode formed thereon, such that said MOSFET is a vertical conduction MOSFET.

22. A vertical conduction MOSFET comprising a silicon wafer having a flat junction receiving region of a first conductivity type; a plurality of channel diffusions of an opposite conductivity type and having a boundary region, a given concentration and a given depth; a plurality of source diffusion regions of said first conductivity type in each of said channel diffusions and having another boundary region, the region between the boundary region of the channel diffusions and the source diffusions defining a plurality of invertible channel regions a conductive gate polysilicon segment overlying at least a portion of a non-self-aligned gate oxide overlying each of said invertible channel regions a plurality second diffusions of said opposite conductivity type having a depth greater than said given depth and disposed beneath each of said channel diffusions and having a lower concentration than said given concentration of said channel diffusions such that graded body diode regions are defined; a plurality of source electrodes in contact with a portion of respective source diffusions and respective ones of said channel diffusions; and a drain electrode in contact with a bottom surface of said silicon wafer, opposite of said plurality of source electrodes.

* * * * *